(12) United States Patent
Hsieh et al.

(10) Patent No.: US 11,017,839 B2
(45) Date of Patent: May 25, 2021

(54) DRAM, MEMORY CONTROLLER AND ASSOCIATED TRAINING METHOD

(71) Applicant: MEDIATEK INC., Hsin-Chu (TW)

(72) Inventors: Bo-Wei Hsieh, Hsinchu (TW); Ching-Yeh Hsuan, Taipei (TW); Shang-Pin Chen, Zhubei (TW)

(73) Assignee: MediaTek Inc., Hsin-Chu (TW)

( * ) Notice: Subject to any disclaimer, the term of this patent is extended or adjusted under 35 U.S.C. 154(b) by 0 days.

(21) Appl. No.: 15/862,884

(22) Filed: Jan. 5, 2018

(65) Prior Publication Data
US 2018/0204610 A1 Jul. 19, 2018

Related U.S. Application Data

(60) Provisional application No. 62/445,819, filed on Jan. 13, 2017.

(51) Int. Cl.
| | |
|---|---|
| *G11C 11/4076* | (2006.01) |
| *G11C 11/4093* | (2006.01) |
| *G11C 11/408* | (2006.01) |
| *G11C 7/10* | (2006.01) |

(52) U.S. Cl.
CPC .......... *G11C 11/4076* (2013.01); *G11C 7/109* (2013.01); *G11C 7/1093* (2013.01); *G11C 11/408* (2013.01); *G11C 11/4093* (2013.01); *G11C 2207/2254* (2013.01)

(58) Field of Classification Search
CPC .......................... G11C 11/4076; G11C 11/408
USPC ....................................................... 365/0.02
See application file for complete search history.

(56) References Cited

U.S. PATENT DOCUMENTS

| | | | | | |
|---|---|---|---|---|---|
| 5,778,439 | A | * | 7/1998 | Trimberger | ...... H03K 19/17748 711/117 |
| 8,395,951 | B2 | * | 3/2013 | Ware | ................... G06F 13/1689 365/194 |
| 9,207,949 | B2 | | 12/2015 | Lee et al. | |
| 9,449,660 | B2 | * | 9/2016 | Wu | .......................... G11C 7/22 |

(Continued)

FOREIGN PATENT DOCUMENTS

| | | |
|---|---|---|
| CN | 101183557 A | 5/2008 |
| JP | H086892 A | 1/1996 |

OTHER PUBLICATIONS

Carmona et al,, A 0.5p.m CMOS CNN analog random access memory chip for massive image processing. Fifth IEEE International Workshop on Cellular Neural Networks and their Applications. Proceedings. Apr. 14, 1998:271-76.*

(Continued)

*Primary Examiner* — Muna A Techane
(74) *Attorney, Agent, or Firm* — Wolf, Greenfield & Sacks, P.C.

(57) ABSTRACT

A training method for a memory system is provided. The memory system includes a memory controller and a memory. The memory controller is connected with the memory. The training method includes the following steps. Firstly, the memory samples n command/address signals according to a first signal edge and a second signal edge of a clock signal to acquire a first sampled content and a second sampled content. The memory selectively outputting one of the first sampled content and the second sampled content through m data signals to the memory controller in response to a control signal. Moreover, m is larger than n and smaller than 2n.

24 Claims, 9 Drawing Sheets

(56) References Cited

U.S. PATENT DOCUMENTS

| | | | |
|---|---|---|---|
| 10,304,547 B2* | 5/2019 | Choi | G11C 7/222 |
| 2004/0120353 A1* | 6/2004 | Kim | G06F 13/385 |
| | | | 370/503 |
| 2009/0219770 A1 | 9/2009 | Shin | |
| 2012/0250433 A1* | 10/2012 | Jeon | G11C 8/18 |
| | | | 365/193 |
| 2013/0083611 A1* | 4/2013 | Ware | G11C 11/4072 |
| | | | 365/191 |
| 2014/0181390 A1 | 6/2014 | Bains et al. | |
| 2014/0189224 A1* | 7/2014 | Kostinsky | G11C 7/1063 |
| | | | 711/105 |
| 2014/0195728 A1* | 7/2014 | Hsu | G06F 12/0246 |
| | | | 711/105 |
| 2016/0259684 A1 | 9/2016 | Park | |
| 2017/0110169 A1* | 4/2017 | Kim | G11C 7/12 |
| 2020/0110716 A1* | 4/2020 | Mozak | H03M 13/09 |

OTHER PUBLICATIONS

TIPO Office Action dated Aug. 8, 2018 in Taiwan application (No. 107101230).

Carmona et al., A 0.5μm CMOS CNN analog random access memory chip for massive image processing. Fifth IEEE International Workshop on Cellular Neural Networks and their Applications. Proceedings. Apr. 14, 1998:271-76.

Lu et al., Self-adaptive synchronization of memory interface based on training. Journal of Shanghai University (Natural Science). Aug. 2015;21(4):393-401.

* cited by examiner

DRAM, MEMORY CONTROLLER AND ASSOCIATED TRAINING METHOD

This application is based on, and claims priority from, U.S. provisional application Ser. No. 62/445,819, filed on Jan. 13, 2017, the disclosure of which is hereby incorporated by reference herein in its entirety.

FIELD OF THE INVENTION

The invention relates to a memory, a memory controller and an associated control method, and more particularly to a dynamic random access memory (DRAM), a memory controller and an associated training method.

BACKGROUND OF THE INVENTION

Generally, a memory system comprises a memory controller and a dynamic random access memory (DRAM). The memory controller is connected with the DRAM. The memory controller can write data into the DRAM or read data from the DRAM. For example, a double data rate DRAM (also abbreviated as DDR DRAM) is one of the common DRAMs. Moreover, DDR3 DRAM is a third generation DDR DRAM, and DDR4 DRAM is a fourth generation DDR DRAM.

FIG. 1A illustrates the architecture of a conventional DDR3 DRAM system. As shown in FIG. 1A, the DDR3 DRAM system 100 comprises a memory controller 120 and a DRAM 110. The DRAM 110 is a low power third generation DDR DRAM (also abbreviated as LPDDR3 DRAM).

Moreover, plural pins of the memory controller 120 are connected with corresponding pins of the DRAM 110 in order to transmit various signals. As shown in FIG. 1A, these signals include a clock enable signal CKE, a clock signal CLK, 10 command/address signals CA0~CA9, a chip select signal CS and 32 data signals DQ0~DQ31. That is, 10 pins are employed to transmit the command/address signals CA0~CA9, and 32 pins are employed to transmit the data signals DQ0~DQ31.

Before the DRAM 110 enters the normal working state, the memory controller 120 has to perform a command/address signal training action on the DRAM 110.

FIG. 1B is a timing waveform diagram illustrating associated signals for controlling a conventional DDR3 DRAM system to perform a command/address signal training action. The command/address signals CA0~CA9 are operated at a double data rate.

At the time point t1, the clock enable signal CKE and the chip select signal CS from the memory controller 120 are in a low level state. Moreover, the memory controller 120 issues the clock signal CLK and the command/address signals CA0~CA9 to the DRAM 110.

At the time point t1, the DRAM 110 samples the contents of the command/address signals CA0~CA9 (CAx R) in response to the rising edge of the clock signal CLK. Similarly, at the time point t2, the DRAM 110 samples the contents of the command/address signals CA0~CA9 (CAx R #) in response to the falling edge of the clock signal CLK. After the time point t2, the chip select signal CS from the memory controller 120 is in a high level state.

The specifications of the DRAM 110 will be described as follows. The sampled contents (CAx R) of the command/address signals CA0~CA9 corresponding to the rising edge of the clock signal CLK are transmitted back to the memory controller 120 through the even-numbered data signals (EVEN DQ). The sampled contents (CAx R #) of the command/address signals CA0~CA9 corresponding to the falling edge of the clock signal CLK are transmitted back to the memory controller 120 through the odd-numbered data signals (ODD DQ).

At the time point t3, the sampled contents (CAx R) are outputted from the DRAM 110 through the even-numbered data signals (EVEN DQ), and the sampled contents (CAx R #) are outputted from the DRAM 110 through the odd-numbered data signals (ODD DQ). According to the outputted contents of the data signals DQ0~DQ31, the memory controller 120 judges whether the DRAM 110 accurately receives the command/address signals CA0~CA9 from the memory controller 120.

Moreover, the memory controller 120 adjusts the phase of the clock signal CLK according to the outputted contents of the data signals DQ0~DQ31.

At the time point t4, the DRAM 110 samples the contents of the command/address signals CA0~CA9 (CAy R) in response to the rising edge of the clock signal CLK. Similarly, at the time point t5, the DRAM 110 samples the contents of the command/address signals CA0~CA9 (CAy R #) in response to the falling edge of the clock signal CLK. After the time point t5, the chip select signal CS from the memory controller 120 is in the high level state.

At the time point t6, the sampled contents (CAy R) are outputted from the DRAM 110 through the even-numbered data signals (EVEN DQ), and the sampled contents (CAy R #) are outputted from the DRAM 110 through the odd-numbered data signals (ODD DQ). According to the outputted contents of the data signals DQ0~DQ31, the memory controller 120 judges whether the DRAM 110 accurately receives the command/address signals CA0~CA9 from the memory controller 120.

After the memory controller 120 adjusts and tests the clock signal CLK many times, the memory controller 120 acquires a sampling margin of the command/address signals CA0~CA9 according to the outputted contents of the data signals DQ0~DQ31.

Since 10 pins are employed to transmit the command/address signals CA0~CA9, the 10-bit content is sampled. Moreover, a total of 20-bit content corresponding to the rising edge and the falling edge of the clock signal CLK is transmitted through the even-numbered data signals (EVEN DQ) and the odd-numbered data signals (ODD DQ).

Generally, 16 pins are prepared for transmitting the even-numbered data signals, and 16 pins are prepared for transmitting the odd-numbered data signals. Since the 10-bit content is transmitted through the even-numbered data signals, 6 pins are not used. Similarly, since the 10-bit content is transmitted through the odd-numbered data signals, the other 6 pins are not used.

FIG. 2A illustrates the architecture of a conventional DDR4 DRAM system. As shown in FIG. 2A, the DDR4 DRAM system 200 comprises a memory controller 220 and a DRAM 210. The DRAM 210 is a low power fourth generation DDR DRAM (also abbreviated as LPDDR4 DRAM).

Moreover, plural pins of the memory controller 220 are connected with corresponding pins of the DRAM 210 in order to transmit various signals. As shown in FIG. 2A, these signals include a clock enable signal CKE, a clock signal CLK, 6 command/address signals CA0~CA5, a chip select signal CS and 16 data signals DQ0~DQ15. That is, 6 pins are employed to transmit the command/address signals CA0~CA5, and 16 pins are employed to transmit the data signals DQ0~DQ15.

Before the DRAM 210 enters the normal working state, the memory controller 220 has to perform a command/address signal training action on the DRAM 210.

FIG. 2B is a timing waveform diagram illustrating associated signals for controlling a conventional DDR4 DRAM system to perform a command/address signal training action. The command/address signals CA0~CA5 are operated at a single data rate.

Before the time point t1, the clock enable signal CKE from the memory controller 220 is in a low level state.

At the time point t1, the memory controller 220 activates the chip select signal CS, and the command/address signals CA0~CA5 indicate the valid data. Consequently, the DRAM 210 samples the content of the command/address signals CA0~CA5 (CA pattern A) in response to the rising edge of the clock signal CLK.

According to the specifications of the DRAM 210, the sampled contents (CA Pattern A) of the command/address signals CA0~CA5 corresponding to the rising edge of the clock signal CLK are transmitted back to the memory controller 220 through 6 pins (e.g., DQ[13:8]) of the data signals DQ0~DQ15.

At the time point t2, the sampled contents (CA Pattern A) are outputted from the DRAM 210 through the data signals DQ[13:8]. According to the outputted contents of the data signals DQ[13:8], the memory controller 220 judges whether the DRAM 210 accurately receives the command/address signals CA0~CA5 from the memory controller 220.

Moreover, the memory controller 220 adjusts the phase of the dock signal CLK according to the outputted contents of the data signals DQ[13:8].

At the time point t3, the DRAM 210 samples the content of the command/address signals CA0~CA5 (CA pattern B) in response to the rising edge of the clock signal CLK.

At the time point t4, the sampled contents (CA Pattern B) are outputted from the DRAM 210 through the data signals DQ[13:8]. According to the outputted contents of the data signals DQ[13:8], the memory controller 220 judges whether the DRAM 210 accurately receives the command/address signals CA0~CA5 from the memory controller 220.

After the memory controller 220 adjusts and tests the clock signal CLK many times, the memory controller 220 acquires a sampling margin of the command/address signals CA0~CA5 according to the outputted contents of the data signals DQ[13:8].

Since 6 pins are employed to transmit the command/address signals CA0~CA6, the 6-bit content is sampled. Consequently, the 6-bit content is transmitted through the 6 data signals (e.g., DQ[13:8]).

However, as the pin number of the data signals for the next generation DDR DRAM gradually decreases, the conventional command/address signal training action cannot be successfully done.

SUMMARY OF THE INVENTION

An embodiment of the invention provides a training method for a memory system with a memory controller and a memory. The memory controller is connected with the memory. The training method includes the following steps. Firstly, the memory samples command/address signals transmitted from the memory controller according to a first signal edge and a second signal edge of a clock signal to acquire a first sampled content and a second sampled content. And, the memory selectively outputs one of the first sampled content and the second sampled content through data signals to the memory controller in response to a control signal.

Another embodiment of the invention provides a memory controller. The memory controller generates plural signals to a memory. The memo controller outputs a clock signal and command/address signals to the memory and receives a first sampled content or a second sampled content through a plurality of data signals from the memory in response to a control signal.

Another embodiment of the invention provides a memory. The memory receives plural signals from a memory controller. The memory samples command/address signals transmitted from the memory controller according to a first signal edge and a second signal edge of a clock signal to acquire a first sampled content and a second sampled content. And, the memory outputs the first sampled content or the second sampled content through a plurality of data signals to the memory controller in response to a control signal.

Another embodiment of the invention provides a training method for a memory system with a memory controller and a memory. The memory controller is connected with the memory. The training method includes the following steps. If the memory is in a first mode, the memory samples command/address signals transmitted from the memory controller according to a first signal edge of a clock signal to acquire a first sampled content, and outputs the first sampled content through a plurality of data signals to the memory controller. And, if the memory is in a second mode, the memory sampling the command/address signals transmitted from the memory controller according to a second signal edge of the clock signal to acquire a second sampled content, and outputting the second sampled content through the data signals to the memory controller.

Another embodiment of the invention provides a memory controller. The memory controller outputs a clock signal and command/address signals to the memory. The memory controller receives a first sampled content through a plurality of data signals from the memory when the memory is in a first mode. And, the memory controller receives a second sampled content through the data signals from the memory when the memory is in a second mode.

Another embodiment of the invention provides a memory. The memory samples the command/address signals transmitted from the memory controller according to a first signal edge of a clock signal and outputs a first sampled content through a plurality of data signals to the memory controller when the memory is in a first mode. And, the memory samples the command/address signals transmitted from the memory controller according to a second signal edge of the clock signal and outputs a second sampled content through the data signals to the memory controller when the memory is in a second mode.

Numerous objects, features and advantages of the invention will be readily apparent upon a reading of the following detailed description of embodiments of the invention when taken in conjunction with the accompanying drawings. However, the drawings employed herein are for the purpose of descriptions and should not be regarded as limiting.

BRIEF DESCRIPTION OF THE DRAWINGS

The above objects and advantages of the invention will become more readily apparent to those ordinarily skilled in the art after reviewing the following detailed description and accompanying drawings, in which.

DETAILED DESCRIPTION OF PREFERRED EMBODIMENTS

As previously described, while the command/address signal training action is performed in the conventional DDR3 DRAM system or the conventional DDR4 DRAM, the DDR3 DRAM or the DDR4 DRAM samples the command/address signals according to the clock signal CLK and automatically outputs the sampled contents through the data signals.

However, as the pin number of the data signals for the next generation DDR DRAM gradually decreases, the conventional command/address signal training action cannot be successfully done.

Figure 1A:
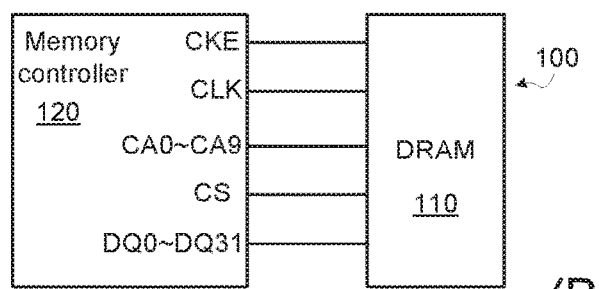
FIG. 1A (prior art) illustrates the architecture of a conventional DDR3 system.
Figure 1B:
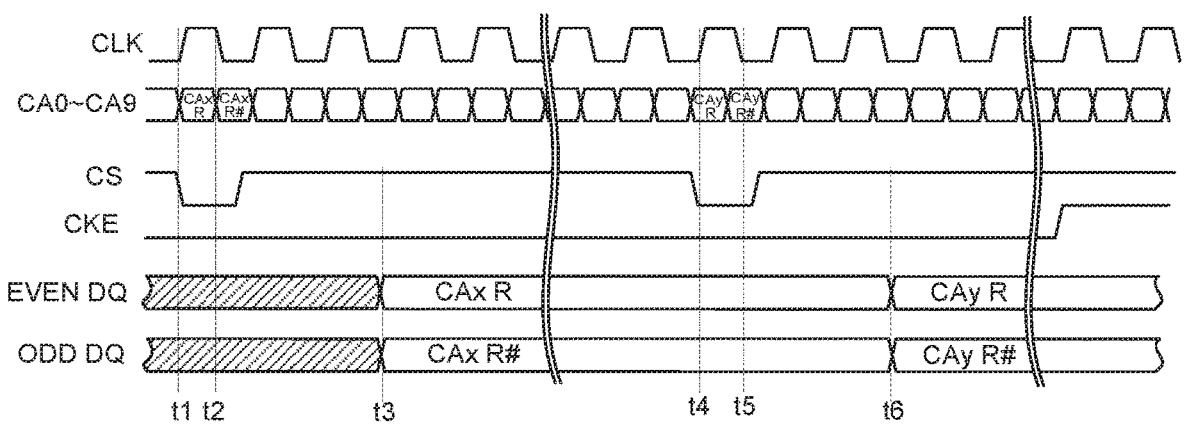
FIG. 1B (prior art) is a timing waveform diagram illustrating associated signals for controlling a conventional DDR3 DRAM system to perform a command/address signal training action.
Figure 2A:
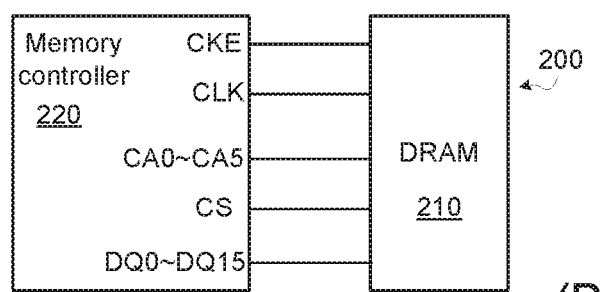
FIG. 2A (prior art) illustrates the architecture of a conventional DDR3 DRAM system.
Figure 2B:
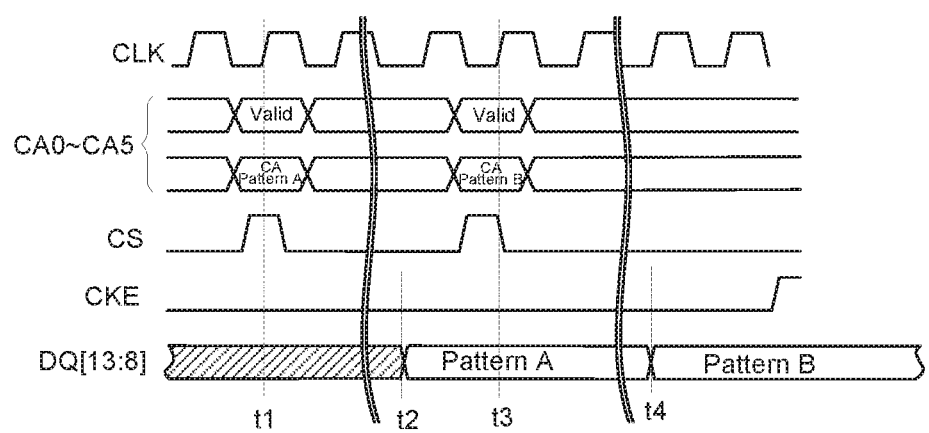
FIG. 2B (prior art) is a timing waveform diagram illustrating associated signals for controlling a conventional DDR4 DRAM system to perform a command/address signal training action.
Figure 3A:
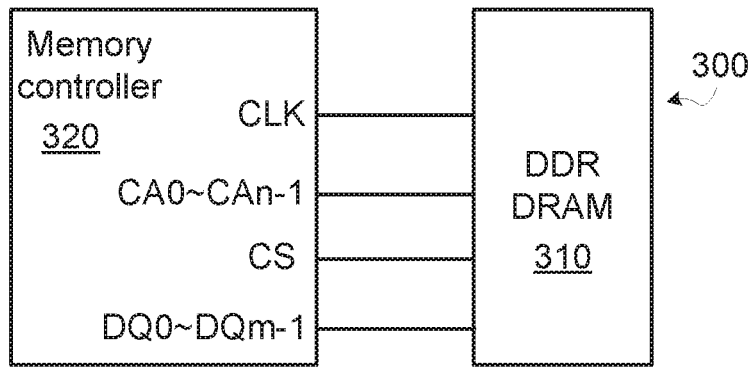
FIG. 3A illustrates the architecture of a DDR DRAM system according to an embodiment of the invention.

FIG. 3A illustrates the architecture of a DDR DRAM system according to an embodiment of the invention. As shown in FIG. 3A, the DDR DRAM system 300 comprises a memory controller 320 and a DDR DRAM 310.

Moreover, plural pins of the memory controller 320 are connected with corresponding pins of the DDR DRAM 310 in order to transmit various signals. As shown in FIG. 3A, these signals include a clock signal CLK, n command/address signals CA0-CAn−1, a chip select signal CS and m data signals DQ0-DQm−1. The command/address signals CA0-CAn−1 are operated at a double data rate. Moreover, n pins are employed to transmit the command/address signals CA0-CAn−1, and m pins are employed to transmit the data signals DQ0-DQm−1. In an embodiment, m is larger than n and smaller than 2n. That is, n<m<2n.

Since the pin number m of the data signals DQ0~DQm−1 is not larger than two times the pin number n of the data signals DQ0~DQm−1, the command/address signal training action for the conventional DDR3 DRAM system cannot be applied to the DDR DRAM 300 of FIG. 3A.

Figure 3B:
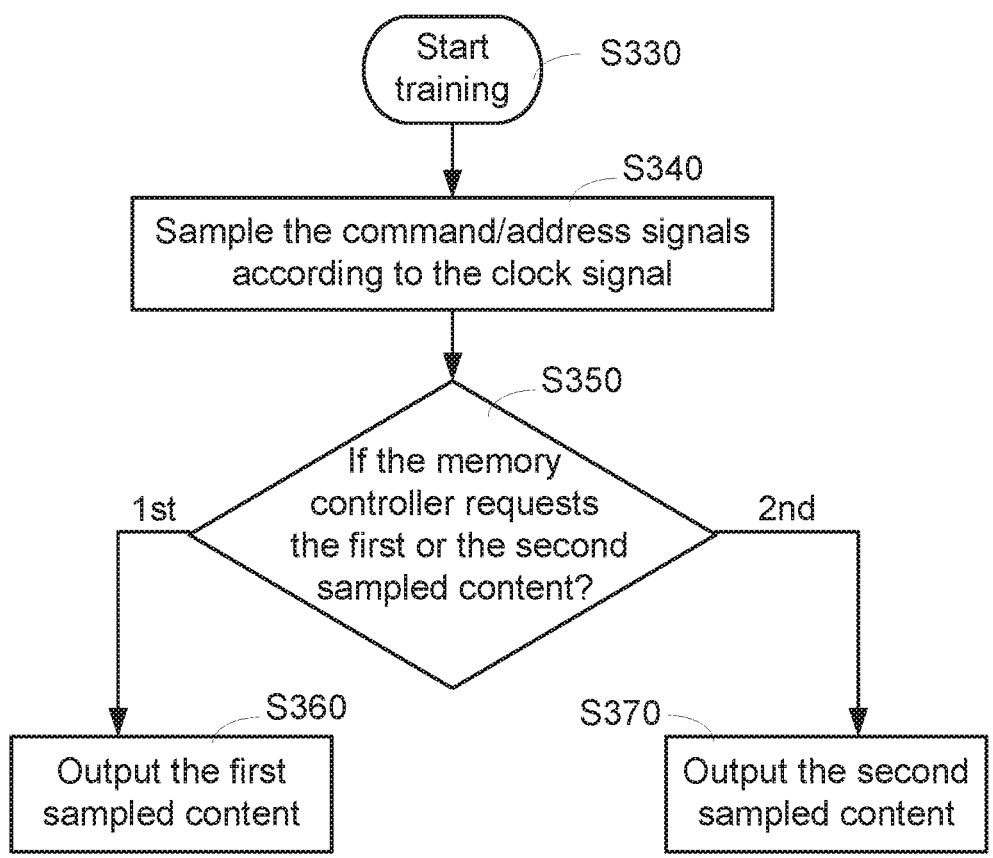
FIG. 3B is flowchart illustrating a method of performing a command/address signal training action in the DDR DRAM system according to a first embodiment of the invention.

FIG. 3B is flowchart illustrating a method of performing a command/address signal training action in the DDR DRAM system according to a first embodiment of the invention.

After the command/address signal training action is started (Step S330), the DDR DRAM 310 samples the command/address signals CA0~CAn−1 according to the clock signal CLK from the memory controller 320 (Step S340). That is, the DDR DRAM 310 samples the command/address signals CA0~CAn−1 in response to the rising edge and the falling edge of the clock signal CLK. Consequently, two sampled contents are acquired.

Then, a step S350 is performed to judge whether the memory controller 320 requests the first sampled content or the second sampled content. If the memory controller 320 requests the first sampled content, the DDR DRAM 310 outputs the first sampled content (Step S360). Whereas, if the memory controller 320 requests the second sampled content, the DDR DRAM 310 outputs the second sampled content (Step S370).

Figure 3C:
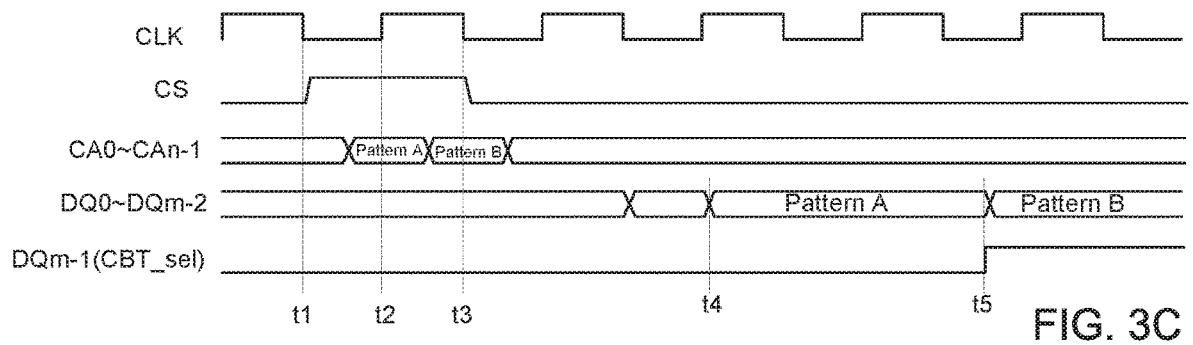
FIG. 3C is a schematic timing waveform diagram illustrating associated signals for controlling the DDR DRAM system to perform a command/address signal training action according to an embodiment of the invention.

FIG. 3C is a schematic timing waveform diagram illustrating associated signals for controlling the DDR DRAM system to perform a command/address signal training action. Since m is larger than n, one of the data signals DQ0~DQm−1 is defined as a command bus training selection signal CBT_sel in the DDR DRAM system 300. For example, the data signal DQm−1 is defined as the command bus training selection signal CBT_sel, and the other data signals DQ0~DQm−2 are used for outputting the sampled contents.

At the time point t1, the memory controller 320 activates the chip select signal CS. Then, the memory controller 320 generates and issues the clock signal CLK and the command/address signals CA0~CAn−1 to the DDR DRAM 310.

At the time point t2, the DDR DRAM 310 samples the content of the command/address signals CA0~CAn−1 (Pattern A) in response to the rising edge of the clock signal CLK. Similarly, at the time point t3, the DDR DRAM 310 samples the content of the command/address signals CA0~CAn−1 (Pattern B) in response to the falling edge of the clock signal CLK. After the time point t3, the memory controller 320 inactivates the chip select signal CS.

In this embodiment, the memory controller 320 requests the sampled contents through the data signals DQ0~DQm−2 according to the command bus training selection signal CBT_sel.

At the time point t4, the command bus training selection signal CBT_sel is in a low level state. Consequently, the sample content (Pattern A) corresponding to the rising edge of the clock signal CLK is outputted from the DDR DRAM 310. At the time point t5, the command bus training selection signal CBT_sel is in a high level state. Consequently, the sample content (Pattern B) corresponding to the falling edge of the clock signal CLK is outputted from the DDR DRAM 310.

In other words, the DDR RAM 310 samples the contents Pattern A and Pattern B according to the clock signal CLK and the command/address signals CA0~CAn−1 while the command/address signal training action is performed. Moreover, the sample content (Pattern A) corresponding to the rising edge of the clock signal CLK is outputted from the DDR DRAM 310 in response to the low level state of the command bus training selection signal CBT_sel. Whereas, the sample content (Pattern B) corresponding to the falling edge of the clock signal CLK is outputted from the DDR DRAM 310 in response to the high level state of the command bus training selection signal CBT_sel.

Since n pins are employed for transmitting the command/address signals CA0~CAn−1, an n-bit sampled content is acquired after each sampling process. Moreover, since m is larger than n, the DDR DRAM 310 outputs the n-bit sampled content through the (m−1) data signals DQ0~DQm−2.

When the memory controller 320 changes the voltage level of the command bus training selection signal CBT_sel, the DDR DRAM 310 outputs two n-bit sampled contents sequentially. According to the outputted contents of the data signals DQ~DQm−2 (i.e., the two n-bit sampled contents), the memory controller 320 judges whether the DDR DRAM 310 accurately receives the command/address signals CA0~CAn−1 from the memory controller 320.

In the above embodiment, the data signal DQm−1 is defined as the command bus training selection signal CBT_sel. It is noted that numerous modifications and alterations may be made while retaining the teachings of the invention. For example, in another embodiment, an additional pin is arranged between the memory controller 320 and the DDR DRAM 310. The additional pin is defined as the command bus training selection signal CBT_sel.

In the above embodiment, the memory controller 320 requests the DDR DRAM 310 to output different sampled contents through the physical pins. Alternatively, according to the settings of a mode register in the DDR DRAM 310, the DDR DRAM 310 is requested to output the designated sampled contents.

As known, the DDR DRAM 310 has the mode register. Moreover, the memory controller 320 may program the mode register of the DDR DRAM 310 in order to control the operations of the DDR DRAM 310. For example, a phase select bit Phase_sel is defined in the mode register of the DDR DRAM 310. While the command/address signal training action is performed, the memory controller 320 programs the phase select bit Phase_sel to request the DDR DRAM 310 to output the designated sampled contents. The related operations will be described as follows.

Figure 3D:
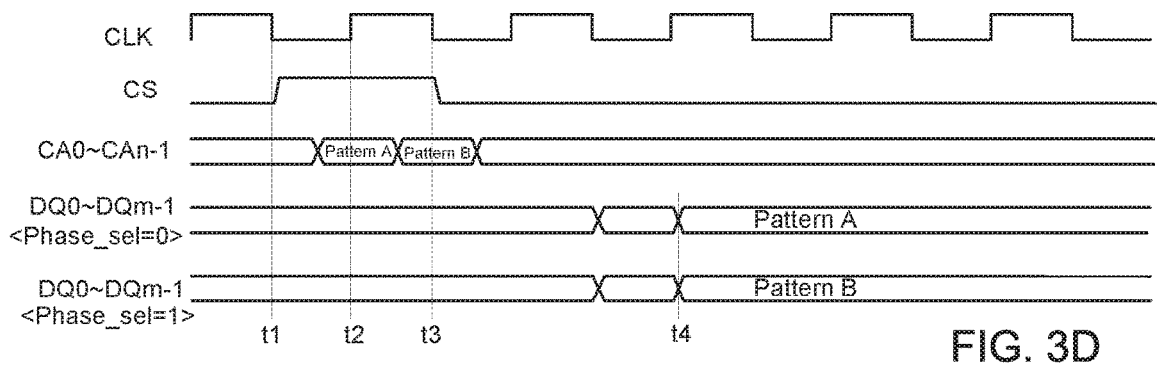
FIG. 3D is a schematic timing waveform diagram illustrating associated signals for controlling the DDR DRAM system to perform a command/address signal training action according to another embodiment of the invention.

FIG. 3D is a schematic timing waveform diagram illustrating associated signals for controlling the DDR DRAM system to perform a command/address signal training action according to another embodiment of the invention. For example, if the phase select bit Phase_sel in the mode register of the DDR DRAM 310 is "0", it means that the memory controller 320 requests the DDR DRAM 310 to output the sampled content corresponding to the rising edge of the clock signal CLK. If the phase select bit Phase_sel in the mode register of the DDR DRAM 310 is "1", it means that the memory controller 320 requests the DDR DRAM 310 to output the sampled content corresponding to the falling edge of the clock signal CLK.

Before the time point t1, a default value of the phase select bit Phase_sel is "0". That is, the DDR DRAM 310 is requested to output the sampled content corresponding to the rising edge of the clock signal CLK.

At the time point t1, the memory controller 320 activates the chip select signal CS. Then, the memory controller 320 generates and issues the clock signal CLK and the command/address signals CA0~CAn−1 to the DDR DRAM 310.

At the time point t2, the DDR DRAM 310 samples the content of the command/address signals CA0~CAn−1 (Pattern A) in response to the rising edge of the clock signal CLK. Similarly, at the time point t3, the DDR DRAM 310 samples the content of the command/address signals CA0~CAn−1 (Pattern B) in response to the falling edge of the clock signal CLK. After the time point t3, the memory controller 320 inactivates the chip select signal CS.

At the time point t4, the sample content (Pattern A) corresponding to the rising edge of the clock signal CLK is outputted from the DDR DRAM 310.

On the other hand, if the default value of the phase select bit Phase_sel is "1" before the time point t1, the DDR DRAM 310 is requested to output the sampled content corresponding to the falling edge of the clock signal CLK. Consequently, the sample content (Pattern B) corresponding to the falling edge of the clock signal CLK is outputted from the DDR DRAM 310 at the time point t4.

In some embodiments, the phase select bit Phase_sel in the mode register is programmed to be after the sample content Pattern A is outputted from the DDR DRAM 310. Consequently, the sample content Pattern B is subsequently outputted from the DR DRAM 310.

According to the outputted contents of the data signals DQ0~DQm−1 (i.e., the two n-bit sampled contents), the memory controller 320 judges whether the DDR DRAM 310 accurately receives the command/address signals CA0~CAn−1 from the memory controller 320.

Figure 3E:
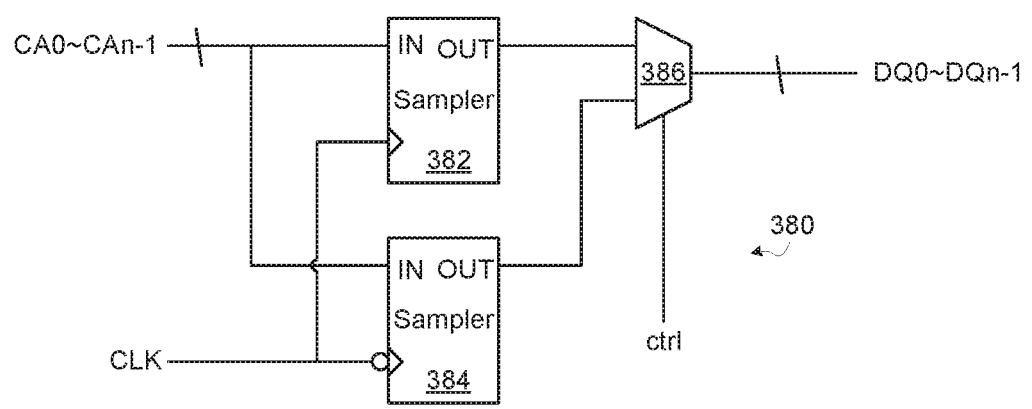
FIG. 3E is a schematic circuit diagram of a sampling circuit of the DDR DRAM according to an embodiment of the invention.

For performing the flowchart of FIG. 3B, the DDR DRAM 310 further comprises a sampling circuit. FIG. 3E is a schematic circuit diagram of a sampling circuit of the DDR DRAM according to an embodiment of the invention. As shown in FIG. 3E, the sampling circuit 380 comprises a rising edge triggering sampler 382, a falling edge triggering sampler 384 and a multiplexer 386. The input terminal IN of the rising edge triggering sampler 382 receives the command/address signals CA0~CAn−1. The output terminal OUT of the rising edge triggering sampler 382 is connected with a first input terminal of the multiplexer 386. The clock terminal of the rising edge triggering sampler 382 receives the clock signal CLK. Moreover, the rising edge triggering sampler 382 samples the command/address signals CA0~CAn−1 in response to the rising edge of the clock signal CLK. The input terminal of the falling edge triggering sampler 384 receives the command/address signals CA0~CAn−1. The output terminal OUT of the falling edge triggering sampler 384 is connected with a second input terminal of the multiplexer 386. The clock terminal of the falling edge triggering sampler 384 receives the clock signal CLK. Moreover, the falling edge triggering sampler 384 samples the command/address signals CA0~CAn−1 in response to the falling edge of the clock signal CLK. Moreover, a select terminal of the multiplexer 386 receives a control signal ctrl. According to the control signal ctrl, the multiplexer 386 selects one of the two samplers 382 and 384 to output the data signals DQ0~DQn−1.

For example, the control signal ctrl is a command bus training selection signal CBT_sel or a phase select bit Phase_sel. Moreover, the samplers 382 and 384 are D flip-flops. In accordance with the invention, the pin number n for the command/address signals CA0~CAn−1 is smaller than the pin number m for the data signals DQ0~DQm−1. Consequently, the output terminal of the multiplexer 386 only need n data signals DQ0~DQn−1.

In case that the control signal ctrl is in a first level state, the sampled content of the rising edge triggering sampler 382 is outputted from the multiplexer 386. That is, the sample content (Pattern A) is outputted from the DDR DRAM 310 through the data signals DQ0~DQn−1. In case that the control signal ctrl is in a second level state, the sampled content of the falling edge triggering sampler 384 is outputted from the multiplexer 386. That is, the sample content (Pattern B) is outputted from the DDR DRAM 310 through the data signals DQ0~DQn−1.

In some embodiments, the memory controller 320 may program the mode register of the DDR DRAM 310 in order to control the command/address signal training action.

Figure 4A:
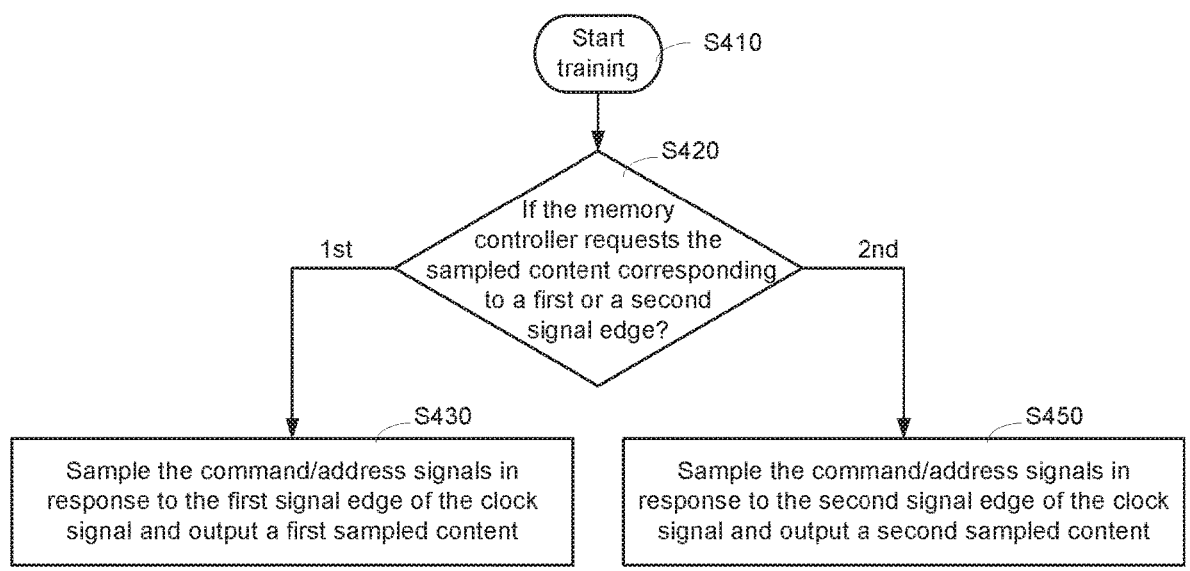
FIG. 4A is flowchart illustrating a method of performing a command/address signal training action in the DDR DRAM system according to a second embodiment of the invention.

FIG. 4A is flowchart illustrating a method of performing a command/address signal training action in the DDR DRAM system according to a second embodiment of the invention. In this embodiment, a command bus training mode bit CBT_mode is defined in the mode register of the DDR DRAM 310. While the command/address signal training action is performed, the DDR DRAM 310 samples the command/address signals CA0~CAn−1 and outputs the sampled contents according to the command bus training mode bit CBT_mode.

Please refer to FIG. 4A. After the command/address signal training action is started (Step S410), a step S420 is performed to judge whether the memory controller 320 requests the sampled content corresponding to a first signal edge or a second signal edge. If the memory controller 320 requests the sampled content corresponding to the first signal edge, the DDR DRAM 310 samples the command/address signals CA0~CAn−1 in response to the first signal edge of the clock signal CLK and outputs a first sampled content (Step S430). If the memory controller 320 requests the sampled content corresponding to the second signal edge, the DDR DRAM 310 samples the command/address signals CA0~CAn−1 in response to the second signal edge of the clock signal CLK and outputs a second sampled content (Step S450).

Figure 4B:
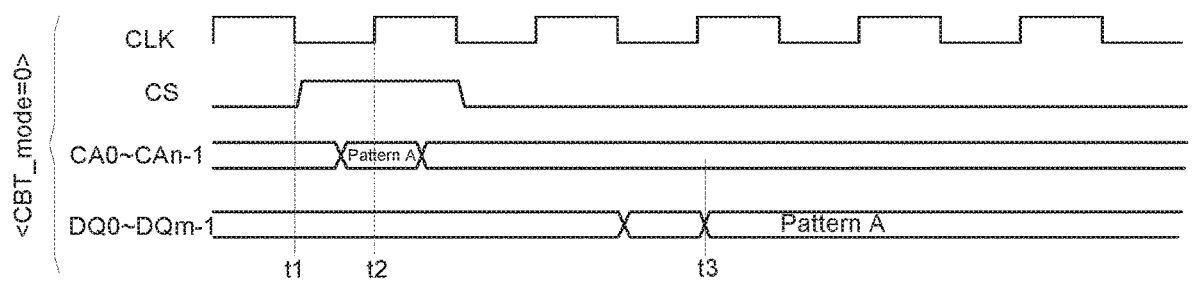
FIGS. 4B and 4C are schematic timing waveform diagrams illustrating associated signals for controlling the DDR DRAM system to perform a command/address signal training action.
Figure 4C:
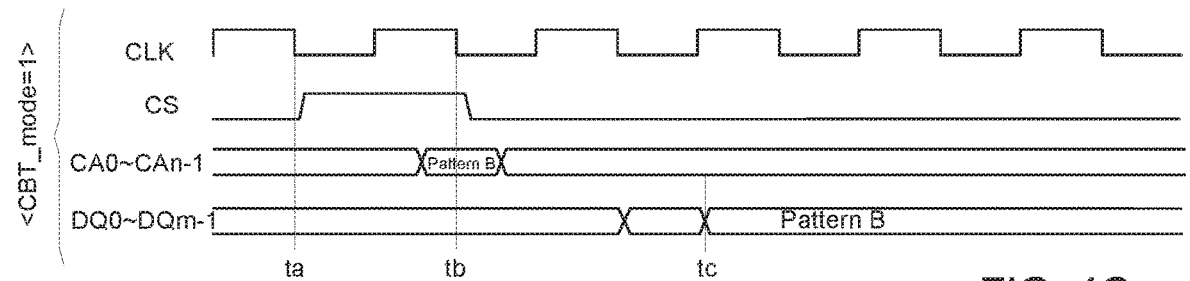

FIGS. 4B and 4C are schematic timing waveform diagrams illustrating associated signals for controlling the DDR DRAM system to perform a command/address signal training action. A command bus training mode bit CBT_mode is defined in the mode register of the DDR DRAM 310. If the command bus training mode bit CBT_mode in the mode register of the DDR DRAM 310 is "0", it means that the DDR DRAM 310 samples the command/address signals CA0~CAn−1 in response to the rising edge of the clock signal CLK. If the command bus training mode bit CBT_mode in the mode register of the DDR DRAM 310 is 1, it means that the DDR DRAM 310 samples the command/address signals CA0~CAn−1 in response to the falling edge of the clock signal CLK.

As shown in FIG. 4B, the command bus training mode bit CBT_mode in the mode register of the DDR DRAM 310 is "0". At the time point t1, the memory controller 320 activates the chip select signal CS. Then, the memory controller 320 generates and issues the clock signal CLK and the command/address signals CA0~CAn−1 to the DDR DRAM 310.

At the time point t2, the DDR DRAM 310 samples the content of the command/address signals CA0~CAn−1 (Pattern A) in response to the rising edge of the clock signal CLK. After the time point t2, the memory controller 320 inactivates the chip select signal CS.

At the time point t3, the sample content (Pattern A) corresponding to the rising edge of the clock signal CLK is outputted from the DDR DRAM 310 through the data signals DQ0~DQm−1.

As shown in FIG. 4C, the command bus training mode bit CBT_mode in the mode register of the DDR DRAM 310 is "1". At the time point ta, the memory controller 320 activates the chip select signal CS. Then, the memory controller 320 generates and issues the clock signal CLK and the command/address signals CA0~CAn−1 to the DDR DRAM 310.

At the time point tb, the DDR DRAM 310 samples the content of the command/address signals CA0~CAn−1 (Pattern B) in response to the falling edge of the clock signal CLK.

At the time point tc, the sample content (Pattern A) corresponding to the falling edge of the clock signal CLK is outputted from the DDR DRAM 310 through the data signals DQ0~DQm−1.

For example, the memory controller 320 programs the command bus training mode bit CBT_mode as "0" to acquire the sample content Pattern A, and then the memory controller 320 programs the command bus training mode bit CBT_mode as "1" to acquire the sample content Pattern B.

That is, the DDR DRAM 310 outputs two n-bit sampled contents sequentially. According to the outputted contents of the data signals DQ0~DQm−1 (i.e., the two n-bit sampled contents), the memory controller 320 judges whether the DDR DRAM 310 accurately receives the command/address signals CA0~CAn−1 from the memory controller 320.

Figure 4D:
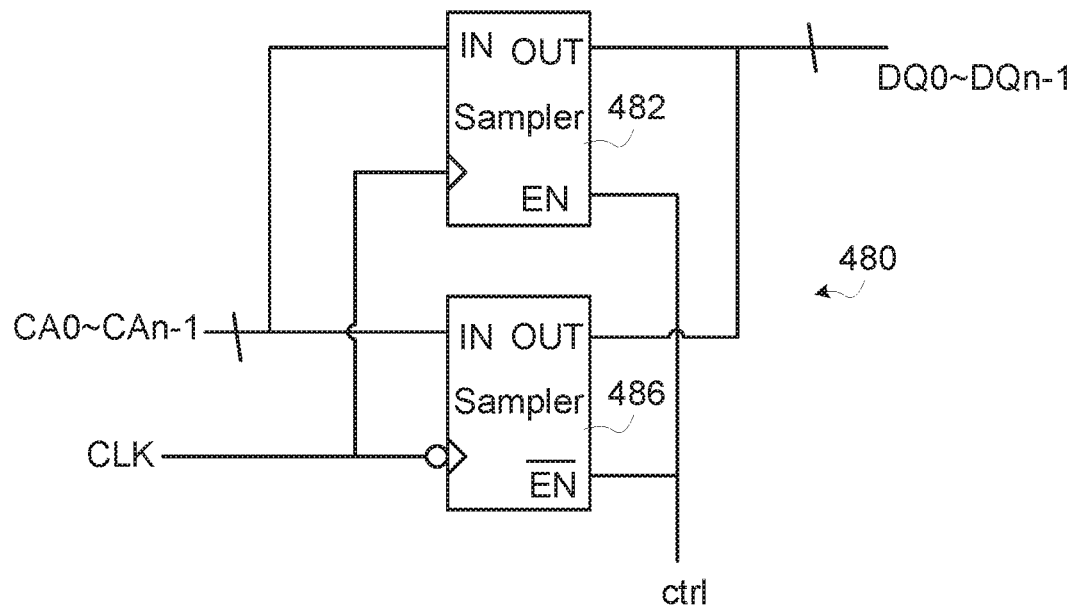
FIG. 4D is a schematic circuit diagram of a sampling circuit of the DDR DRAM according to an embodiment of the invention.

For performing the flowchart of FIG. 4A, the DDR DRAM 310 further comprises a sampling circuit. FIG. 4D is a schematic circuit diagram of a sampling circuit of the DDR DRAM according to an embodiment of the invention.

As shown in FIG. 4D, the sampling circuit 480 comprises a rising edge triggering sampler 482 and a falling edge triggering sampler 486. The input terminal IN of the rising edge triggering sampler 482 receives the command/address signals CA0~CAn−1. The enable terminal EN of the rising edge triggering sampler 482 receives the control signal ctrl. The clock terminal of the rising edge triggering sampler 482 receives the clock signal CLK. Moreover, the rising edge triggering sampler 482 samples the command/address signals CA0~CAn−1 in response to the rising edge of the clock signal CLK. The input terminal of the falling edge triggering sampler 486 receives the command/address signals CA0~CAn−1. The inverted enable terminal $\overline{EN}$ of the falling edge triggering sampler 486 receives the control signal ctrl. The clock terminal of the falling edge triggering sampler 486 receives the clock signal CLK. Moreover, the falling edge triggering sampler 486 samples the command/address signals CA0~CAn−1 in response to the falling edge of the clock signal CLK. Moreover, the output terminals of the two samplers 482 and 486 are connected with each other to output the data signals DQ0~DQn−1.

For example, the control signal ctrl is the command bus training mode bit CBT_mode. Moreover, the samplers 482 and 486 are D flip-flops. In accordance with the invention, the pin number n for the command/address signals CA0~CAn−1 is smaller than the pin number m for the data signals DQ0~DQm−1. Consequently, the output terminal of the sampler 482 and the output terminal of the sampler 486 only need n data signals DQ0~DQn−1.

In case that the control signal ctrl is in a first level state, only the rising edge triggering sampler 482 is enabled to output the sampled content. That is, the sample content (Pattern A) is outputted from the DDR DRAM 310 through the data signals DQ0~DQn−1. In case that the control signal ctrl is in a second level state, only the falling edge triggering sampler 486 is enabled to output the sampled content. That is, the sample content (Pattern B) is outputted from the DDR DRAM 310 through the data signals DQ0~DQn−1.

Figure 5A:
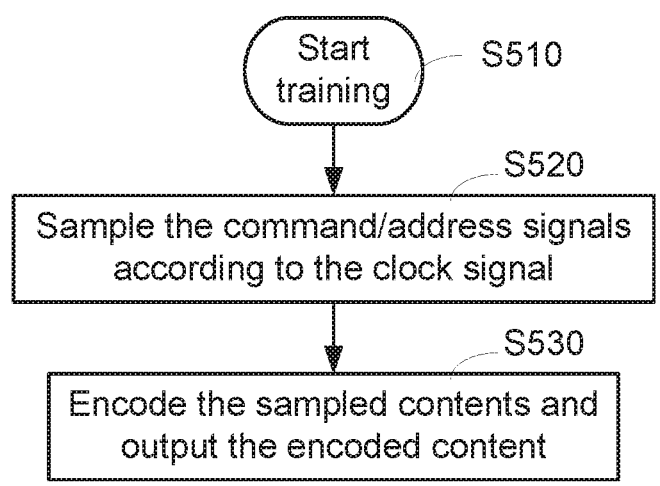
FIG. 5A is flowchart illustrating a method of performing a command/address signal training action in the DDR DRAM system according to a third embodiment of the invention.

FIG. 5A is flowchart illustrating a method of performing a command/address signal training action in the DDR DRAM system according to a third embodiment of the invention. In this embodiment, the sampled content Pattern A and the sampled content Pattern B are subjected to an encoding operation. Consequently, the bit number of the encoded content is effectively reduced. Moreover, the encoded content is outputted through the data signals DQ0~DQm−1.

After the command/address signal training action is started (Step S510), the DDR DRAM 310 samples the command/address signals CA0~CAn−1 according to the clock signal CLK from the memory controller 320 (Step S520). That is, the DDR DRAM 310 samples the command/address signals CA0~CAn−1 in response to the rising edge and the falling edge of the clock signal CLK. Consequently, two sampled contents are acquired. Then, the sampled contents are encoded, and the encoded content is outputted (Step S530).

Figure 5B:
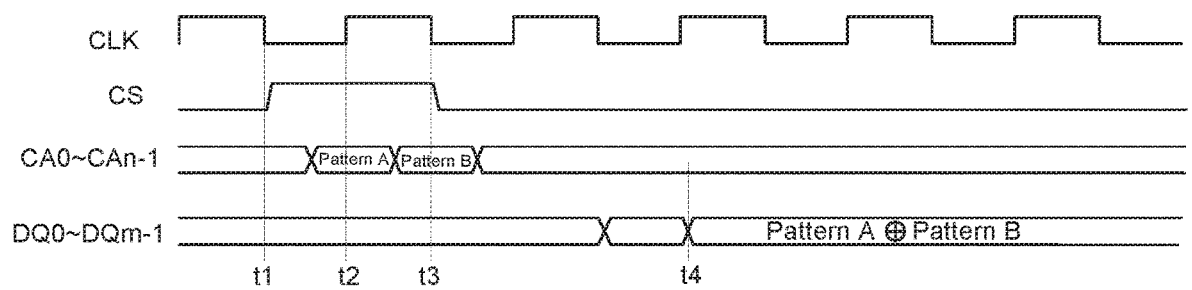
FIG. 5B is a schematic timing waveform diagram illustrating associated signals for controlling the DDR DRAM system to perform a command/address signal training action.

FIG. 5B is a schematic timing waveform diagram illustrating associated signals for controlling the DDR DRAM system to perform a command/address signal training action. At the time point t1, the memory controller 320 activates the chip select signal CS. Then, the memory controller 320 generates and issues the clock signal CLK and the command/address signals CA0~CAn−1 to the DDR DRAM 310.

At the time point t2, the DDR DRAM 310 samples the content of the command/address signals CA0~CAn−1 (Pattern A) in response to the rising edge of the clock signal CLK. At the time point t3, the DDR DRAM 310 samples the content of the command/address signals CA0~CAn−1 (Pattern B) in response to the falling edge of the clock signal CLK. After the time point t3, the memory controller 320 inactivates the chip select signal CS.

After the sampled content Pattern A and the sampled content Pattern B are acquired, the DDR DRAM 310 performs an encoding operation on the sampled content Pattern A and the sampled content Pattern B and generates an encoded content. The bit number of the encoded content is smaller than m. Moreover, the encoded content is outputted through the data signals DQ~DQm−1.

At the time point t4, the DDR DRAM 310 outputs the encoded content through the data signals DQ0~DQm−1. For example, the encoding operation is an exclusive OR operation. After the exclusive OR operation is performed on the sampled content Pattern A and the sampled content Pattern B, the encoded content is generated. It is noted that the encoding operation is not restricted. For example, the encoding operation includes any appropriate logic operation.

According to the encoded content through the data signals DQ0~DQm−1, the memory controller 320 performs a decoding operation. Consequently, the sampled content Pattern A and the sampled content Pattern B are acquired.

According to the sampled content Pattern A and the sampled content Pattern B, the memory controller 320 judges whether the DDR DRAM 310 accurately receives the command/address signals CA0~CAn−1 from the memory controller 320.

Figure 5C:
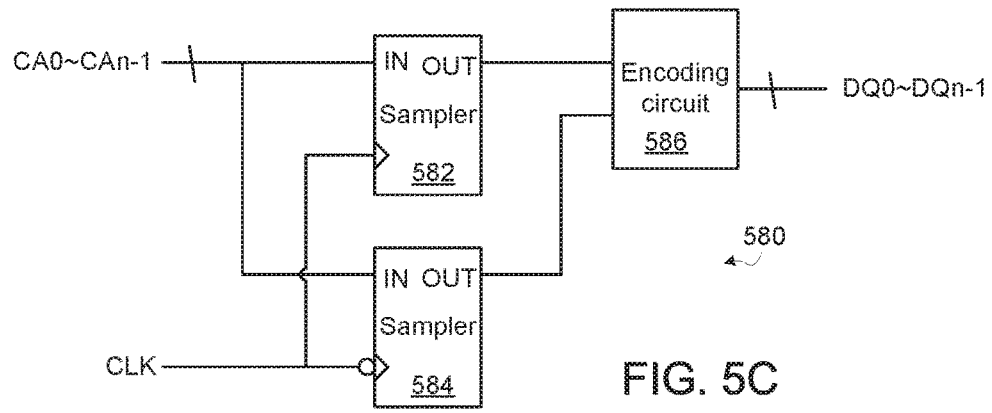
FIG. 5C is a schematic circuit diagram of a sampling circuit of the DDR DRAM according to an embodiment of the invention.

For performing the flowchart of FIG. 5A, the DDR DRAM 310 further comprises a sampling circuit. FIG. 5C is a schematic circuit diagram of a sampling circuit of the DDR DRAM according to an embodiment of the invention.

As shown in FIG. 5C, the sampling circuit 580 comprises a rising edge triggering sampler 582, a falling edge triggering sampler 584 and an encoding circuit 586. The input terminal IN of the rising edge triggering sampler 582 receives the command/address signals CA0~CAn−1. The output terminal OUT of the rising edge triggering sampler 582 is connected with a first input terminal of the encoding circuit 586. The clock terminal of the rising edge triggering sampler 582 receives the clock signal CLK. Moreover, the rising edge triggering sampler 582 samples the command/address signals CA0~CAn−1 in response to the rising edge of the clock signal CLK. The input terminal of the falling edge triggering sampler 584 receives the command/address signals CA0~CAn−1. The output terminal OUT of the falling edge triggering sampler 584 is connected with a second input terminal of the encoding circuit 586. The clock terminal of the falling edge triggering sampler 584 receives the clock signal CLK. Moreover, the falling edge triggering sampler 584 samples the command/address signals CA0~CAn−1 in response to the falling edge of the clock signal CLK.

The encoding circuit 586 is used for encoding the signals from the samplers 582 and 584 and outputting the encoded content through the data signals DQ0~DQn−1. Since the bit number of the encoded content is smaller than m, the encoded content can be outputted through the data signals DQ0~DQn−1.

From the above descriptions, the invention provides a DRAM, a memory controller and a training method for a next generation DDR DRAM system. Even if the pin number of the data signals for the DDR DRAM is small, the memory controller can successfully perform the command/address signal training action.

It is noted that numerous modifications and alterations may be made while retaining the teachings of the invention. In another embodiment, the memory controller is connected to one of various kinds of memories including a volatile memory, a non-volatile memory, an SRAM and a Flash memory to form a memory system, and the disclosed training method may be applied to the memory system.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A training method for a memory system with a memory controller and a memory, the memory controller being connected with the memory, the training method comprising steps of:

the memory sampling command/address signals transmitted from the memory controller in response to rising edge of a clock signal to acquire first sampled content and a falling edge of the clock signal to acquire second sampled content; and the memory selectively outputting one of the first sampled content and the second sampled content through a plurality of data signals to the memory controller in response to a control signal, wherein the rising edge of the clock signal and the falling edge of the clock signal are consecutive edges of the clock signal.

2. The training method as claimed in claim 1, wherein the memory outputs the first sampled content when the control signal is in a first state, and the memory outputs the second sampled content when the control signal is in a second state.

3. The training method as claimed in claim 1, wherein the control signal is connected between the memory controller and the memory.

4. The training method as claimed in claim 1, wherein the memory controller programs a specified bit of a mode register of the memory, and the specified bit is the control signal.

5. The training method as claimed in claim 1, wherein one of the plurality of data signals is the control signal.

6. The training method of claim 1, wherein the memory controller transmits n command/address signals, the memory outputs one of the first sampled content and the second sampled content through n of m data signals, m is larger than n, and m is smaller than 2n.

7. A memory receiving plural signals from a memory controller, wherein the memory samples command/address signals transmitted from the memory controller in response to a rising edge of a clock signal to acquire first sampled content and a falling edge of the clock signal to acquire second sampled content, and the memory outputs the first sampled content or the second sampled content through a plurality of data signals to the memory controller in response to a control signal, wherein the rising edge of the clock signal and the falling edge of the clock signal are consecutive edges of the clock signal.

8. The memory as claimed in claim 7, wherein the memory outputs the first sampled content when the control signal is in a first state, or the memory outputs the second sampled content when the control signal is in a second state.

9. The memory as claimed in claim 7, wherein a control signal is connected between the memory controller and the memory.

10. The memory as claimed in claim 7, wherein the memory controller programs a specified bit of a mode register of the memory, and the specified bit is the control signal.

11. The memory as claimed in claim 7, wherein one of the plurality of data signals is the control signal.

12. The memory of claim 7, wherein the memory controller transmits n command/address signals, the memory outputs the first sampled content or the second sampled content through n of m data signals, m is larger than n, and m is smaller than 2n.

13. A memory receiving plural signals from a memory controller, wherein the memory samples command/address signals transmitted from the memory controller in response to a rising edge of a clock signal to acquire first sampled content and a falling edge of the clock signal to acquire second sampled content, and the memory outputs the first sampled content or the second sampled content through a plurality of data signals to the memory controller in response to a control signal, further comprising a sampling circuit, wherein the sampling circuit comprises:

a rising edge triggering sampler including input terminals receiving the command/address signals and a clock terminal receiving the clock signal, wherein the rising edge triggering sampler acquires the first sampled content in response to a rising edge of the clock signal;

a falling edge triggering sampler including input terminals receiving the command/address signals and a clock terminal receiving the clock signal, wherein the falling edge triggering sampler acquires the second sampled content in response to a falling edge of the clock signal; and a multiplexer connected with output terminals of the rising edge triggering sampler and output terminals of the falling edge triggering sampler, wherein the multiplexer outputs the first sampled content or the second sampled content through the plurality of data signals to the memory controller according to the control signal.

14. A training method for a memory system with a memory controller and a memory, the memory controller being connected with the memory, the training method comprising steps of:

if the memory is in a first mode, the memory sampling command/address signals transmitted from the memory controller in response to a rising edge of a clock signal to acquire a first sampled content, and outputting the first sampled content through a plurality of data signals to the memory controller; and if the memory is in a second mode, the memory sampling the command/address signals transmitted from the memory controller in response to a falling edge of the clock signal to acquire a second sampled content, and outputting the second sampled content through the plurality of data signals to the memory controller, wherein the rising edge of the clock signal and the falling edge of the clock signal are consecutive edges of the clock signal.

15. The training method as claimed in claim 14, wherein the memory controller programs a specified bit of a mode register of the memory, and the specified bit indicates the first mode or the second mode.

16. The training method of claim 14, wherein the memory controller transmits n command/address signals, the memory outputs the first sampled content or the second sampled content through n of m data signals, m is larger than n, and m is smaller than 2n.

17. A memory controller generating plural signals to a memory, wherein the memory controller outputs a clock signal and command/address signals to the memory, the memory controller receives a first sampled content through a plurality of data signals from the memory when the memory is in a first mode in which the first sampled content is sampled in response to a rising edge of a clock signal, and the memory controller receives a second sampled content through the plurality of data signals from the memory when the memory is in a second mode in which the second sampled content is sampled in response to a falling edge of a clock signal, wherein the rising edge of the clock signal and the falling edge of the clock signal are consecutive edges of the clock signal.

18. The memory controller as claimed in claim 17, wherein the memory controller programs a specified bit of a mode register of the memory, and the specified bit indicates the first mode or the second mode.

19. The memory controller as claimed in claim 17, wherein the memory is a DRAM.

20. The memory controller of claim 17, wherein the memory controller includes n pins employed to transmit the command/address signals and m pins employed to transmit the plurality of data signals, m is larger than n, and m is smaller than 2n.

21. A memory receiving plural signals from a memory controller, wherein the memory samples the command/address signals transmitted from the memory controller in response to a rising edge of a clock signal and outputs a first sampled content through a plurality of data signals to the memory controller when the memory is in a first mode, and the memory samples the command/address signals transmitted from the memory controller in response to a falling edge of the clock signal and outputs a second sampled content through the plurality of data signals to the memory controller when the memory is in a second mode,
wherein the rising edge of the clock signal and the falling edge of the clock signal are consecutive edges of the clock signal.

22. The memory as claimed in claim 21, wherein the memory controller programs a specified bit of a mode register of the memory, and the specified bit indicates the first mode or the second mode.

23. The memory of claim 21, wherein the memory controller transmits n command/address signals, the memory outputs the first sampled content or the second sampled content through n of m data signals, m is larger than n, and m is smaller than 2n.

24. A memory receiving plural signals from a memory controller, wherein the memory samples the command/address signals transmitted from the memory controller in response to a rising edge of a clock signal and outputs a first sampled content through a plurality of data signals to the memory controller when the memory is in a first mode, and the memory samples the command/address signals transmitted from the memory controller in response to a falling edge of the clock signal and outputs a second sampled content through the plurality of data signals to the memory controller when the memory is in a second mode, further comprising a sampling circuit, wherein the sampling circuit comprises:
a rising edge triggering sampler including input terminals receiving the command/address signals and a clock terminal receiving the clock signal, wherein the rising edge triggering sampler acquires the first sampled content in response to a rising edge of the clock signal; and
a falling edge triggering sampler including input terminals receiving the command/address signals and a clock terminal receiving the clock signal, wherein the falling edge triggering sampler acquires the second sampled content in response to a falling edge of the clock signal;
wherein the rising edge triggering sampler is enabled and outputs the first sampled content through the plurality of data signals to the memory controller in the first mode; and
the falling edge triggering sampler is enabled and outputs the second sampled content through the plurality of data signals to the memory controller in the second mode.

* * * * *